United States Patent [19]

Robinson et al.

[11] Patent Number: 4,759,488

[45] Date of Patent: Jul. 26, 1988

[54] CIRCUIT BOARD CARRIER

[75] Inventors: Anthony H. J. Robinson, Richmond Hill; Stephen J. Evans, Toronto; John D. Dransfield, Milton, all of Canada

[73] Assignee: Northern Telecom Limited, Montreal, Canada

[21] Appl. No.: 12,590

[22] Filed: Feb. 9, 1987

[51] Int. Cl.$^4$ .............................................. B23K 1/00
[52] U.S. Cl. .................................... 228/43; 228/44.7; 269/903
[58] Field of Search ...................... 228/43, 44.7, 44.3; 269/903; 439/70, 83; 361/329

[56] References Cited

U.S. PATENT DOCUMENTS 4,311,265  1/1982  Kondo .................................. 228/43

FOREIGN PATENT DOCUMENTS 1190548  11/1985  U.S.S.R. ........................... 228/180.1

OTHER PUBLICATIONS

Research Disclosure, Mar. 1987, #275, anonymous.
Corsaro, Western Electric Technical Digest, No. 62, Apr. 1981.
Byrd, WE Technical Digest, No. 44, Oct. 1976.
Sharp, Western Electric Technical Disclosure, No. 36, Oct. 1974.

Primary Examiner—Nicholas P. Godici
Assistant Examiner—Karen Skillman
Attorney, Agent, or Firm—Sidney T. Jelly

[57] ABSTRACT

A carrier for holding a circuit board while passing round an automated insertion line has a rectangular frame with support members extending in from the inner periphery. In a particular example, the support members on three sides have support surfaces and lateral locating surfaces. Spring retaining members are provided, one above each support surface. On the fourth side, support members only have support surfaces in the example. At each end of the fourth side, a laterally deflectable cantilever spring member holds down the circuit board along the fourth side. An external flange provides a support for the carrier on a conveyor. The inner periphery is shaped to avoid interference with the solder wave and to avoid causing turbulence.

18 Claims, 6 Drawing Sheets

CIRCUIT BOARD CARRIER

BACKGROUND OF THE INVENTION

1. Field of the Invention

This invention relates to a carrier for carrying a circuit board during component insertion and soldering, and to the mounting and soldering of components on a circuit board using a board carrier.

2. Related Art

Conventionally, circuit boards are handled individually for either hand insertion of components or automated insertion of components. A combination of hand insertion and automated insertion can be used. The boards are handled without using any carrier. Boards may be positioned in the equivalent of a carrier at particular positions, for example, at an automated insertion machine, but are removed prior to sending to a subsequent position. Assembled boards are then put into a carrier for passage through a wave soldering machine.

A board does not have to be accurately positioned in a carrier for the wave soldering, but at other positions a high level of positional accuracy is required. Direct handling of the boards themselves occurs at each insertion or other position.

SUMMARY OF THE INVENTION

The present invention provides a carrier into which a board is inserted at the beginning of an assembly process, remaining in the carrier at all insertion stages, inspection stages and any other stages, and finally carries the board through the soldering and cleaning operations.

A carrier, in accordance with the present invention, comprises a rectangular frame having a plurality of inwardly projecting support members spaced around the inner periphery of the frame. The support members provide support and edge location for a circuit board. Resilient retaining members are provided at at least some of the support members, to hold a circuit board down on the support members. A first degree of positional alignment is provided by the support members and retaining members, but some lateral movement of the board within the frame can occur, to permit a second degree of alignment at a process station. The frame fits sufficiently close to the periphery of the circuit board as to prevent solder from flowing between board and frame onto the top surface of the board. Also, the frame is shaped to avoid interference with the solder wave and to avoid causing turbulence, which could affect soldering.

BRIEF DESCRIPTION OF THE DRAWINGS

The invention will be readily understood by the following description of certain embodiments, by way of example, in conjunction with the accompanying drawings, in which.

DETAILED DESCRIPTION OF THE EMBODIMENTS

Figure 1:
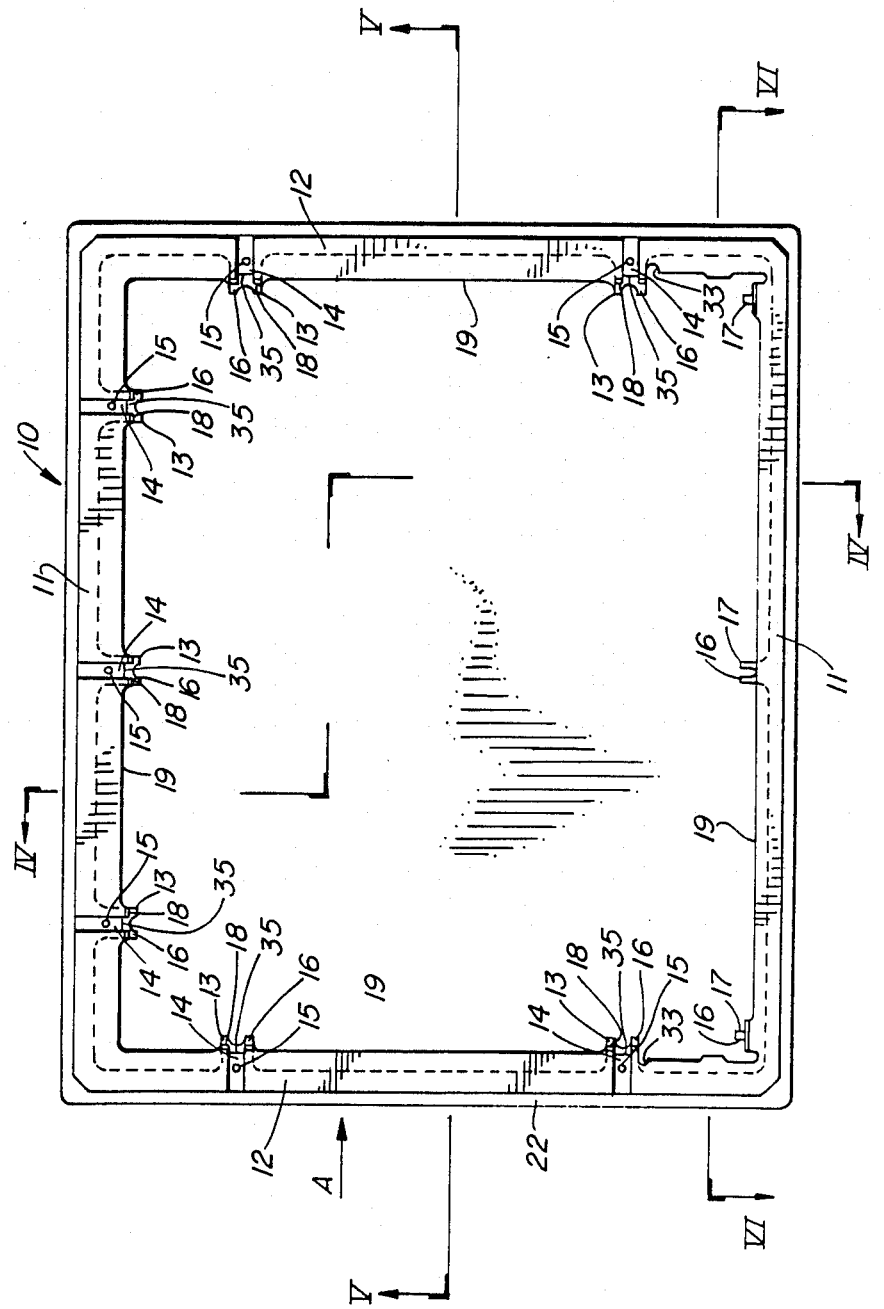
FIG. 1 is a top plan view of a carrier.

As illustrated in FIGS. 1 to 6, a carrier, designated generally at 10, comprises a rectangular frame having relatively narrow sides 11 and ends 12. Along one side 11 are three support members 13 extending inward from the frame. Similar support members 13 also extend inward at each end. At the support members provision is made for mounting a spring retaining member. The retaining members are seated in shallow grooves 14 and held in position by screws screwing into threaded holes 15. A support member and spring retaining member is seen in more detail in FIGS. 7 and 8. Further support members 17 extend in from the other side 11. These members 17 do not, in the example, have means for mounting a spring retaining member.

The support members 13 and 17 each have a support surface 16, which extend in a common plane. Support members 13 also have a lateral locating surface 18 which provides for positioning the board within the frame. These locating surfaces are positioned slightly inward from the inner periphery 19 of the frame. This leaves a small gap around the board, but the gap is small enough that surface tension will prevent liquid solder passing up through the gap onto the top surface of the board during wave soldering.

Figure 4:
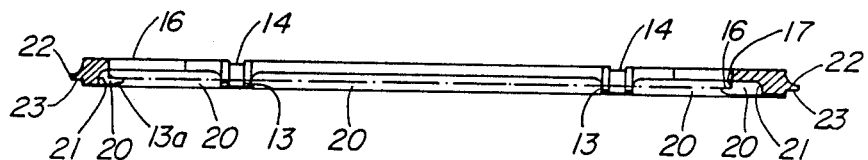
FIG. 4 is a cross-section on the line IV—IV of FIG. 1.
Figure 5:
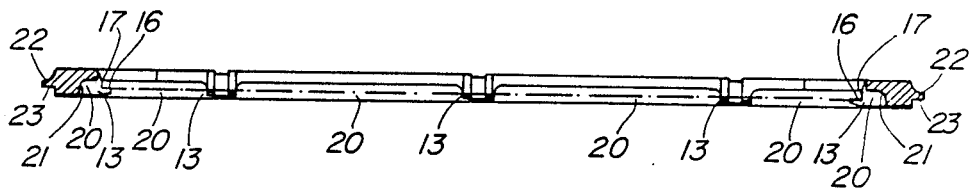
FIG. 5 is a cross-section on the line V—V of FIG. 1.
Figure 6:
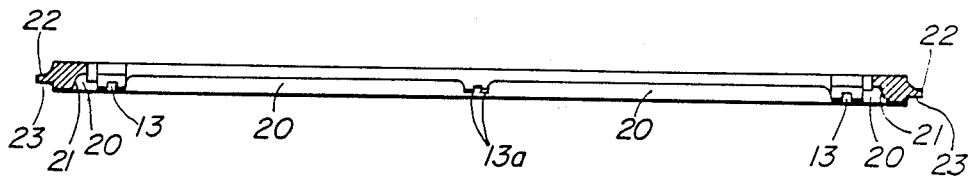
FIG. 6 is a cross-section on the line VI—VI of FIG. 1.

The undersurface of the frame is recessed at the inner peripheral surface. As seen in FIGS. 4, 5 and 6, the undersurface has a peripherally extending recess 20 which has an arcuate surface 21. This shaped recess allows the solder wave to enter the frame with mimimum turbulence. A peripherally extending external flange 22 provides a support surface 23 for sliding on rails of a conveyor system.

Figure 7:
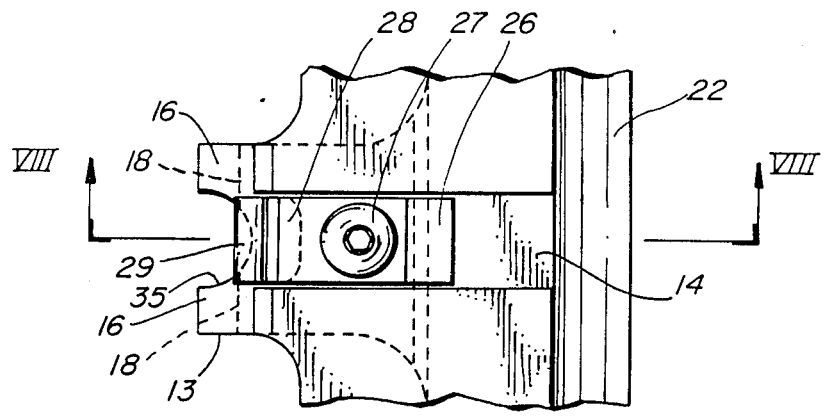
FIG. 7 is a top plan view of a support position to an enlarged scale, showing a resilient retaining member.
Figure 8:
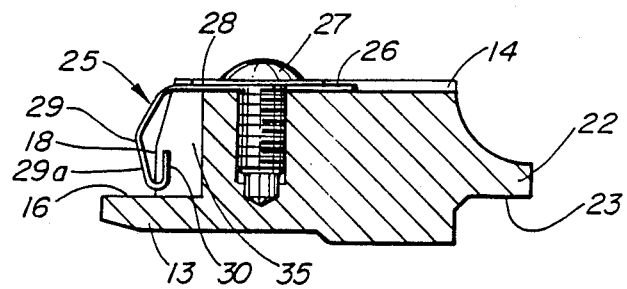
FIG. 8 is a cross-section on the line VIII—VIII of FIG. 7.

FIGS. 7 and 8 illustrate one support member 13 in more detail, together with a spring retaining member 25. Support surface 16 is seen as well as the locating surface 18. The retaining member has a straight tail portion 26 which fits in the groove 14 and held in place by screw 27, and a spring washer member 28. The retaining member has a downward projecting portion 29 which has a very shallow Vee form viewed from the side. The bottom, free, end of the retaining member is bent back up inside, at 30. When a circuit board is pushed down into the frame the projecting portion 29 of the retaining members are pushed back. The board is then held down by the lower leg 29a of the portion 29.

Figure 9:
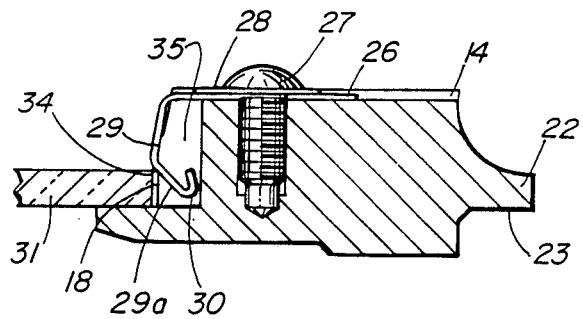
FIG. 9 is a similar view to that of FIG. 8, illustrating the positioning of a circuit board.

The support members 13 are recessed, at 35, to enable the free end of the spring retaining member 25 to be deflected sufficiently. The deflected position of a retaining member, with a circuit board 31 in position, is illustrated in FIG. 9.

Figure 2:
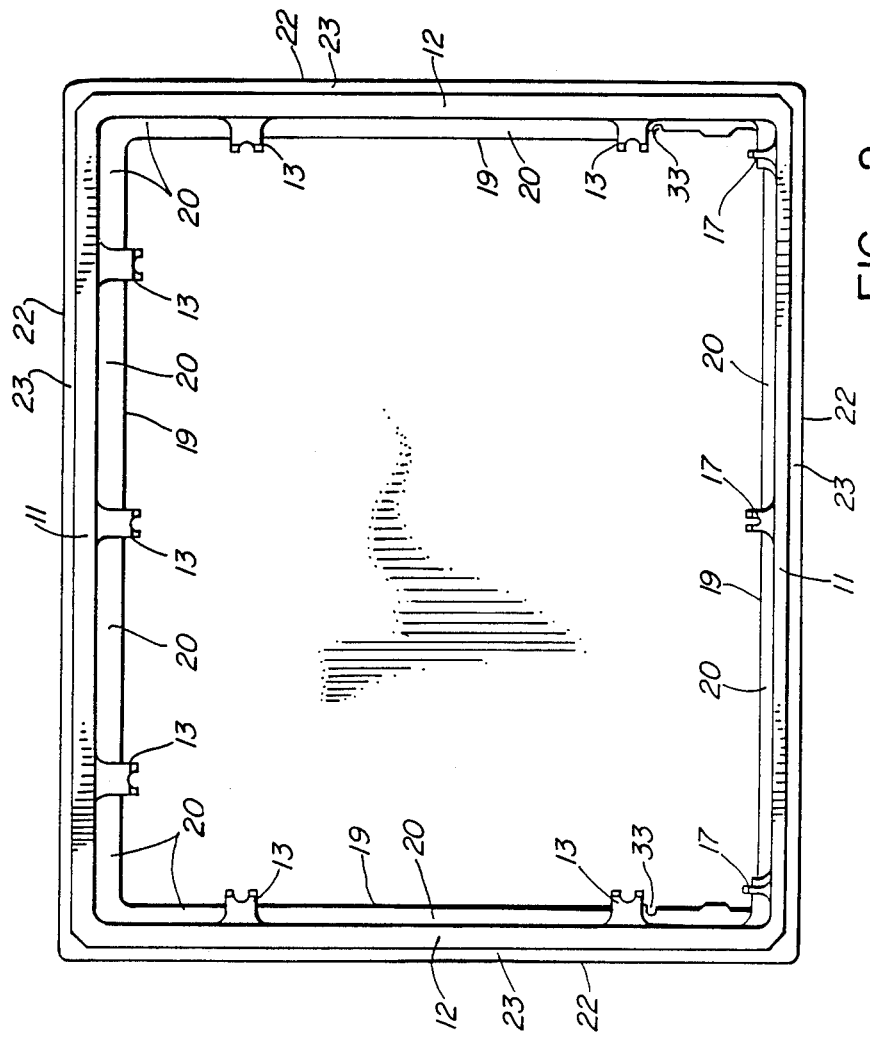
FIG. 2 is a bottom plan view of a carrier.
Figure 3:
FIG. 3 is an end view of a carrier in the direction of arrow A in FIG. 1.
Figure 10:
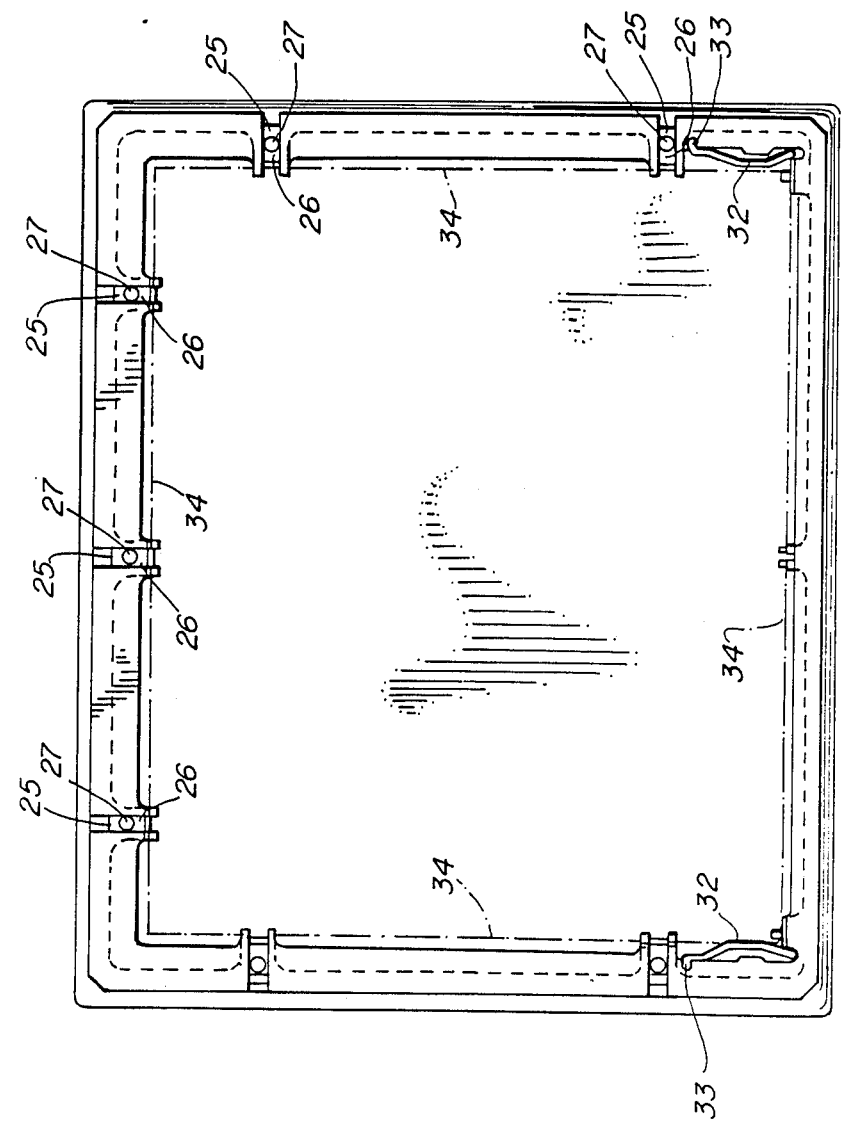
FIG. 10 is a similar view to that of FIG. 1, with the retaining members in position.

In the example illustrated in FIGS. 1 and 2 and in FIG. 10, as described previously, support members 17 on one side do not have provision for mounting spring retaining members 25. Two laterally mounted cantilever spring members 32 are mounted in recesses 33 formed in end walls 12 near their conjunction with the side wall 11 which has the support members 17. The free ends of the members 32 are positioned behind the end support members 17. This is illustrated in FIG. 10. Also indicated in dotted outline is the peripheral edge 34 of a circuit board in its loaded position in the carrier. In their released positions, as shown in FIG. 10, the cantilever spring members extend over the ends of the circuit board.

A small clearance is provided between the peripheral edge 34 of the circuit board 31 and the locating surfaces 18. This is to provide for a small movement of the board in the frame. The locating surfaces ensure that the boards are within a determined positional tolerance on insertion in a frame. Not seen in FIG. 10 are the slight clearances between the board edges and the locating surfaces 18. These permit some slight movement of the board in the carrier at a processing station. It has been found that attempting to accurately position a board in a carrier and then attempting to accurately position a carrier at a processing station does not provide for consistent location of board relative to the operating head of the apparatus at the processing station. In the carrier of the invention,. the board is held with an initial positioning accurate enough for locating members at the processing station to locate in a primary locating hole and secondary locating holes in each circuit board whereby final positioning is provided by the locating members at the processing station. Any slight variations in board profile and carrier external profile are therefore non-effective so far as final positioning of a board at a processing station is concerned.

While reference has been made to a circuit board, such circuit board can be a single relatively large board, or a plurality of smaller circuit boards still united into a single board, that is, before subdividing into individual boards.

The very small holding positions give minimum interference with soldering and enable efficient cleaning to be obtained. The carrier is conveniently made of aluminum alloy with a surface layer which will not accept solder. The carrier is cleaned at the same time that the board is cleaned and is ready for immediate reuse.

Boards are inserted at an automated loading position, as described later, and stay in the carrier until final assembly, solder, and clean. The board is carried round the automated processing line without handling. If necessary, boards can be routed to and from storage, still in the carrier. Static protection is provided by the metal carrier.

By providing a supporting flange, 22, all round the carrier, it is possible to change the orientation of the board and carrier. While it will normally be that the support and guide rails of the conveyor system will be the same distance apart for the total length of the conveyor, at processing stations it is possible to rotate the carrier to provide for required orientation for insertion of components. The support and guide rails at these stations are arranged to carry the carrier at the different orientation. At the soldering position, it is possible to change the orientation of the board to provide for the best direction of movement of the board relative to the solder wave, when wave soldering. A turntable can be provided at the entry to the wave soldering apparatus. A viewing head scans the bar code and the board and carrier will be rotated as determined by the information provided in the control of the computer. If the rotation presents a narrower, or wider, dimension to the soldering apparatus, the support and guide rails are automatically moved to the correct spacing for support of the carrier.

The carrier of the present invention is particularly suitable, and intended, for automated manufacture of circuit boards. In the system, a variety of circuit boards can be manufactured. Usually the boards are all the same size, but the actual circuit pattern, the type, number and position of components, will vary. Each board is printed with a code—typically a bar code. The boards are fed to an inspection station where the boards are scanned and the bar code determined. This is fed to a computer, which determines whether the manufacturing details are already stored in the local memory of each station where the board will be operated on. If the information is available, no further output occurs. If not available, then the central computer uploads the memory associated with each relevant station.

The board is then loaded into a carrier at a loading station. The station has two guide pins extending upward, the upper ends of the pins being chamfered. The boards are lowered at one edge first, being guided by the guide pins. The guide pins extend up through the carrier and the chamfered ends push the cantilever spring members 32 outward toward the ends 12. The guide pins also engage with the periphery 34 of the board. The board is then pushed down by the loading machine and snaps under the spring retaining members. The carrier and board are lifted up from the loading station and the spring members 32 move inward over the board edges. The carrier and board are then passed to the main conveyor which feeds round the entire assembly arrangement, branch or side conveyors feeding individual stations.

Figure 11:
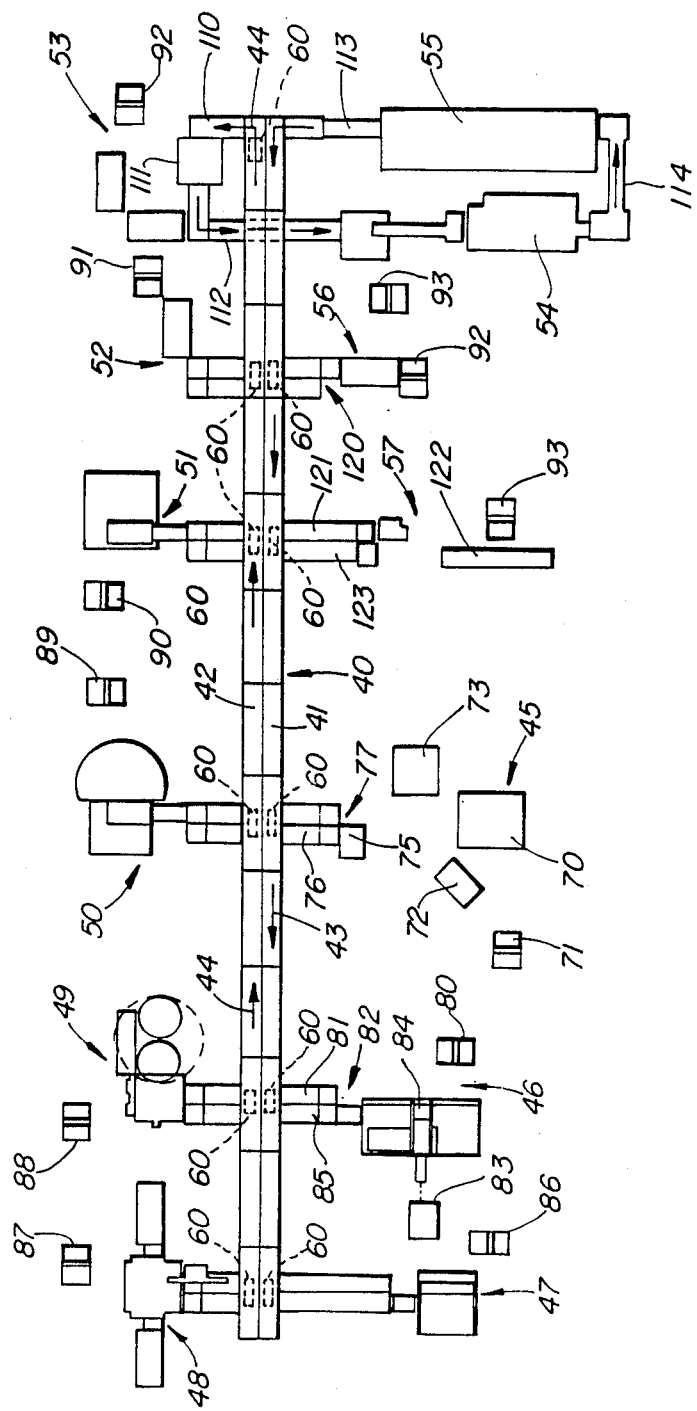
FIG. 11 is a diagrammatic illustration of one form of an insertion system, using carriers of the invention.

FIG. 11 illustrates one particular layout or arrangement for the assembly of components to a circuit board and the soldering of the components to the circuit pattern on the circuit board.

The arrangement illustrated in FIG. 11 comprises a continuous conveyor system indicated generally at 40, having two immediately adjacent, side-by-side, runs 41 and 42. The runs 41 and 42 can move objects in both directions, as required, but in the present description will be considered as moving in the directions of arrows 43 and 44. At various positions along the conveyor system are positioned stations at which operations on the circuit board are carried out. An exemplary cycle comprises board preparation at a station 45, and component insertion stations at 46, 47, 48 and 49. A further station 50 can be provided for the mounting of so-called "oddform" components. A further component insertion station 51 and a manual station 52 can also be provided. Then follows a visual inspection station 53, from which the circuit boards in their carriers pass to the soldering apparatus 54 and cleaning apparatus 55. Then follows a solder inspection station 56. The boards and carriers then pass to a station 57 where the boards are removed from the carriers, the carriers returned to the conveyor 41 and the boards fed to a packing position. The various stations and soldering and cleaning apparatus are connected to the main conveyor system by branch conveyors. It may not be necessary for each board to be passed to each station as, depending upon the particular circuit board, a variation in components required can occur. The information relating to each board is obtained from the above-mentioned bar code. The code is scanned by a view head 60 positioned at each branch conveyor serving a station.

A more detailed description of each station, or apparatus, is as follows. At the board preparation station, circuit boards are fed one at a time from a stack by the automated handling machine 70 controlled by a local computer controller 71. The board is positioned on a table 72 for any modifications to circuit pattern or other modification, then passed to a connector assembly position 73 for mounting of a connector on one edge of the board. A bar code is then applied to the connector. The particular bar code is applied under control of a central computer, not shown, and is related to the circuit pattern on the board and to the required components. Finally, the circuit board is picked up and positioned in a carrier, at 75. The carrier and board are then positioned on the inward feeding side 76 of conveyor 77. The carrier and board are transferred from conveyor side 76 onto the conveyor run 41 by a mechanism, not shown, which lifts the carrier and translates it to the run 41, lowers the carrier and then disengages, to permit the carrier to move.

The bar code is viewed at the view head 60 positioned immediately before the insertion station 46. The view head is connected to, and provides an input to, the local controller 80 for station 46. If the board is one having a circuit which requires components which are inserted at station 46, a stop lifts up in the run 41 to stop the carrier and a mechanism, not shown, lifts the carrier and translates it to the outgoing side 81 of branch conveyor 82. The carrier and board move to an insertion position at station 46, the board being accurately positioned by pins moving up and engaging in the primary and secondary location holes in the circuit board. The controller 80 controls the feed of components from a stock holder 83 to an insertion machine 84. After all components inserted at station 46 have been inserted, the carrier is picked up and moved to the ingoing side 85 of the branch conveyor 82, moved to the run 41 of the main conveyor, then lifted up and moved over onto the run 41, where it continues its movement along run 41.

This sequence of steps is repeated for each station. The local controllers 86, 87, 88, 89, 90, 91, 92, 93, 94 and 95 control movement of carriers and boards for the stations 47, 48, 49, 50, 52, 56 and 57 and soldering apparatus 54 and cleaning apparatus 55, respectively. Each local controller for a station is aware as to what is needed for each particular circuit board, having been informed of the requirements initially from the central computer. The local view head informs the related local controller which particular board is about to be fed to the station—unless the bar code is one which will not cause a local controller to direct a carrier to its related branch conveyor.

After having been fed past all the various stations 46 to 52, with lateral transfer to and from such stations as are determined for each particular board, all carriers and boards pass to the inspection station 53. Here the boards are inspected, particularly for correct position and orientation of leads. The carriers are moved onto outward feeding branch conveyor 110, through the visual inspector 111 and across the main conveyor via branch conveyor 112, being fed to, and through, wave soldering apparatus 54. Depending upon the pattern on the circuit board, orientation of components, and other factors, a particular orientation of the board may be required. This is indicated from information retained in the local controller 93 and resulting from an input from the view head for the soldering apparatus. Generally, the circuit boards and carriers are oblong and therefore the guide and support rails are capable of being varied in spacing to support carriers at either of two orientations at 90° to each other.

From the soldering apparatus 54, the carriers and boards pass along conveyor 114 to the cleaning apparatus 55. The carriers then proceed back to the main conveyor 40, to run 41 and pass to the solder inspection station 56, via branch conveyor 120. After inspection, the carriers and boards return to the run 41 and proceed to the station 57 via branch conveyor 121. At station 57, a plate moves up with chamfered pins which push back the cantilever spring 32, in FIG. 10. The circuit board is then lifted out of the carrier, snapping past the retainers 25. The boards are passed to conveyor 122, while the carrier returns via conveyor 123 to the run 41 for reuse.

At some position in the path around the assembly, boards may be deflected to a temporary or more long term storage. This may be because of too many boards clogging the main conveyor or because a particular station is out of stock of a particular component, or components.

Automated testing can be provided after cleaning and the boards can remain in the carriers into and through the testing station.

What is claimed is:

1. A circuit board carrier, for carrying a circuit board during automated insertion of components and soldering of such components, the carrier comprising a rectangular frame having an inner and outer periphery; a peripherally extending flange extending externally on all four sides of said frame, said flange including a support surface for supporting said carrier for movement on a transporting member, said carrier being supportable for said movement alternately on each pair of opposed sides, a plurality of support members projecting inwardly from said inner periphery; each of said support members having a support surfact, the support surfaces extending in a common plane, for supporting a circuit board in the frame; at least some of said support members each having a lateral locating surface for positioning a circuit board within the frame; a plurality of spring retaining members extending over at least some of said support surfaces for holding a circuit board against said support surfaces.

2. A carrier as claimed in claim 1, said locating surfaces positioned inward of said inner periphery.

3. A carrier as claimed in claim 1, said plurality of support members including a first plurality of support members each having a support surface and a locating surface, and also including a second plurality of support members having a support surface only.

4. A carrier as claimed in claim 3, one of said spring retaining members positioned over each of said first plurality of support members.

5. A carrier as claimed in claim 3, said first plurality of support members being positioned on three sides of said frame, said second plurality of support members being positioned on the fourth side.

6. A carrier as claimed in claim 5, including a laterally defectable cantilever spring member at each end of said fourth side, said cantilever spring members extending over a circuit board edge, when a circuit board is in position, to hold said circuit board down on said support surfaces.

7. A carrier as claimed in claim 6, each of said cantilever spring members comprising a free end positioned at the junction of said fourth side and the adjacent side, a pivotal end mounted in a recess in the side at a position spaced from said junction, an intermediate portion extending inward of said inner periphery, the intermediate portion extending over the circuit board when the circuit board is in position.

8. A carrier as claimed in claim 7, including a stop member at each end of said fourth side, said free ends of said cantilever spring members in contact with said stop members to restrict inward deflection of said spring contact members.

9. A carrier as claimed in claim 1, each of said locating surfaces positioned to provide a small clearance between locating surface and circuit board periphery when a circuit board is in position.

10. A carrier as claimed in claim 4, each said spring retaining member comprising a tail member extending outward from said inner periphery, a downward projecting portion having a shallow Vee formation in side view and extending down inside said inner periphery.

11. A carrier as claimed in claim 10, including a recess in each of said first plurality of support members, at an inner edge thereof, each of said spring retaining members having a free end bent round and outward and being positioned in a recess.

12. A circuit board carrier, for carrying a circuit board during automated insertion of components and soldering of such components, the carrier comprising a rectangular frame having an inner and an outer periphery; said frame including an undersurface and an arcuate recess in said undersurface extending around said inner periphery, the arcuate recess facing inward of said frame; a plurality of support members projecting inwardly from said inner periphery; each of said support members having a support surface, the support surfaces extending in a common plane, for supporting a circuit board in the frame; at least some of said support members each having a lateral locating surface for positioning a circuit board within the frame; a plurality of spring retaining members extending over at least some of said support.

13. A circuit board carrier, for carrying a circuit board during automated insertion of components and soldering of such components, the carrier comprising a rectangular frame having an inner and an outer periphery; a plurality of support members projecting inwardly from said inner periphery; each of said support members having a support surface, the support surfaces extending in a common plane, for supporting a circuit board in the frame; at least some of said support members each having a lateral locating surface for positioning a circuit board within the frame; a plurality of spring retaining members extending over at least some of said support surfaces for holding a circuit board against said support surfaces; said plurality of support members including a first plurality of support members each having a support surface and a locating surface, and also including a second plurality of support members having a support surface only, said first plurality of support members being positioned on three sides of said frame, said second plurality of support members being positioned on the fourth side; further including a laterally defectable cantilever spring member at each end of said fourth side, said cantilever spring members extending over a circuit board edge, when a circuit board is in position, to hold said circuit board down on said support surfaces, a first side opposite to and parallel to said fourth side, and second and third sides joining first and fourth sides at opposite ends, said cantilever spring members being mounted at ends of said second and third sides at a junction with said fourth side.

14. A carrier as claimed in claim 12, said locating surfaces positioned inward of said inner periphery.

15. A carrier as claimed in claim 12, said plurality of support members including a first plurality of support members each having a support surface and a locating surface, and also including a second plurality of support members having a support surface only.

16. A carrier as claimed in claim 15, one of said spring retaining members positioned over each of said plurality of support members.

17. A carrier as claimed in claim 15, said first plurality of support members being positioned on three sides of said frame, said second plurality of support members being positioned on the fourth side.

18. A carrier as claimed in claim 17, including a laterally deflectable cantilever spring members at each end of said fourth side, said cantilever spring member extending over a circuit board edge, when a circuit board is in position, to hold said circuit board down on said support surfaces.

* * * * *